United States Patent [19]

Elms

[11] Patent Number: 5,289,191

[45] Date of Patent: Feb. 22, 1994

[54] BIPOLAR ANALOG-TO-DIGITAL CONVERSION APPARATUS WITH UNIPOLAR CURRENT AND VOLTAGE MODES

[75] Inventor: Robert T. Elms, Monroeville, Pa.

[73] Assignee: Westinghouse Electric Corp., Pittsburgh, Pa.

[21] Appl. No.: 943,800

[22] Filed: Sep. 11, 1992

Related U.S. Application Data

[63] Continuation-in-part of Ser. No. 915,171, Jul. 15, 1992, which is a continuation-in-part of Ser. No. 746,019, Aug. 15, 1991.

[51] Int. Cl.$^5$ .............................................. H03M 1/12
[52] U.S. Cl. .................................... 341/127; 341/155
[58] Field of Search ................................ 341/127, 155

[56] References Cited

U.S. PATENT DOCUMENTS

| | | | |
|---|---|---|---|
| 3,982,240 | 9/1976 | Waehner | 341/127 |
| 4,310,830 | 1/1982 | Babini et al. | 341/127 |
| 4,410,880 | 10/1983 | Zaborowski | 341/127 |
| 4,975,700 | 12/1990 | Tan et al. | 341/118 |
| 4,978,959 | 12/1990 | Chong et al. | 341/161 |

Primary Examiner—Marc S. Hoff
Attorney, Agent, or Firm—M. J. Moran

[57] ABSTRACT

An integrated circuit incorporating an analog-to-digital (A/D) conversion subsystem having a current mode in which only negative analog currents are converted and a voltage mode in which only positive analog voltages are converted is adapted to produce bipolar digital current and voltage signals. An on-board microprocessor operates the A/D conversion subsystem to perform a conversion in the current mode. If the converted digital value is non-zero, this value is used as the negative digital value of analog input signal. If the result of the conversion in the current mode is zero, a second conversion is made in the voltage mode and used as digital value with a positive polarity. An input circuit having an output impedance substantially equal to the "full scale equivalent" input impedance of the IC defined as the full scale voltage of the IC divided by the full scale current, eliminates the need for special scale factors to correlate the positive and negative conversion values.

7 Claims, 4 Drawing Sheets

FIG. 1

BIPOLAR ANALOG-TO-DIGITAL CONVERSION APPARATUS WITH UNIPOLAR CURRENT AND VOLTAGE MODES

RELATED APPLICATION

This application is a continuation-in-part of application U.S. Ser. No. 07/915,171, filed Jul. 15, 1992 and entitled "Energy Monitoring System For A Plurality Of Local Stations with Snap Shot Polling From A Central Station", which in turn is a continuation-in-part of application Ser. No. 07/746,019 filed on Aug. 15, 1991 and entitled "Energy Monitoring System For A Plurality Of Local Stations With Snapshot Polling From A Central Station."

BACKGROUND OF THE INVENTION

1. Field of the Invention

This invention relates to analog-to-digital conversion apparatus, and more particularly, to an analog-to-digital converter having unipolar current and voltage conversion modes of opposite polarity adapted to perform bipolar current and voltage analog-to-digital conversions.

2. Background Information

Commonly owned U.S. patent applications Ser. No. 07/470,471, filed on Jan. 26, 1990 entitled "SuRE Chip" discloses an integrated circuit (IC) and more particularly, a complimentary metal oxide semiconductor (CMOS) IC which includes an on board microprocessor, and analog-to-digital (A/D) subsystem, and various input/output devices on a single monolithic chip for use in various types of electrical equipment, such as circuit breakers, motor controllers, contactors and the like for converting analog signals, such as electrical voltages and currents, to digital signals for monitoring and control. This IC has several analog input channels which are capable of performing analog-to-digital conversions on either currents or voltages. However, it is only capable of performing conversions on negative currents and positive voltages. There are several applications of the SuRE Chip which require A/D conversions of signals which have both positive and negative values at different times. To date, this has required additional circuitry to process the bipolar signals. For instance, a full wave rectifier and a comparator providing a polarity bit have been used for this purpose.

There is a need for a simpler, less expensive arrangement for adapting the A/D subsystem of the IC to make bipolar A/D conversions.

SUMMARY OF THE INVENTION

This need and others are satisfied by the invention in which bipolar conversions are made for both analog voltage and analog current input signals by using the current mode to convert analog signals, both voltage and current, of one polarity, and using the voltage mode to convert analog signals of the opposite polarity. In order to eliminate the need to apply scaling factors to the resultant digital signals generated in the two modes, an input circuit is provided which has an equivalent output impedance that is equal to the equivalent IC "input impedance" as defined as the "full scale input voltage" divided by the "full scale input current" of the chip.

More particularly, the invention is directed to apparatus for generating a bipolar digital signal from a bipolar analog signal which includes an analog-to-digital converter having inputs which include input means selectable between a current mode in which analog signals of a first polarity only are converted to digital signals, and a voltage mode in which analog signals of a second polarity only are converted to digital signals. The apparatus further includes means selecting either the current mode or the voltage mode for generation of a first digital signal from an analog signal applied to the input means, and means presenting the first digital signal as the bipolar digital signal when the first digital signal is non-zero. When the first digital signal is zero, the selecting means selects the other of the current and voltage modes for generation of a second digital signal and the second digital signal is then presented as the bipolar digital signal.

In order to eliminate the need for special scaling to match the digital signals generated in the two modes, an input circuit is provided which has an output impedance substantially equal to the input impedance of the input means, which is defined as the full scale input voltage of the input means divided by the full scale input current. Where the analog input signal is a current signal, the input circuit comprises impedance means connected between an input terminal of the input means and ground with this impedance means presenting an output impedance to the input terminal substantially equal to the input impedance of the input means. Where the analog input signal is a voltage, the voltage is applied to the input terminal through a series input impedance having substantially the value of the input impedance of the input mean.

A practical embodiment of the invention usable with both current and voltage analog inputs, either of which may exceed the input limits of the analog-to-digital conversion means, includes an input circuit with a burden resistor connected between an input node to which the analog current or voltage input is applied and ground. An input resistor is connected between this node and an input terminal of the input means. An impedance matching resistor is connected between the input terminal and ground. The input terminal is at virtual ground when the input means is the current mode so that this resistor is short circuited. In the voltage mode, the input terminal is virtually open circuited, and the impedance of the burden resistor plus the input resistor in parallel with the impedance matching resistor presents an output impedance which substantially matches the input impedance of the input means.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

The invention will be described as implemented with the SuRE Chip integrated circuit (IC) described in U.S. patent application Ser. No. 07/636,643, filed on Dec. 28, 1990 and entitled "SuRE Chip" which is hereby incorporated by reference into this application. This referenced application may be referred to for a detailed description of the full operation of the SuRE Chip IC.

Figure 1:
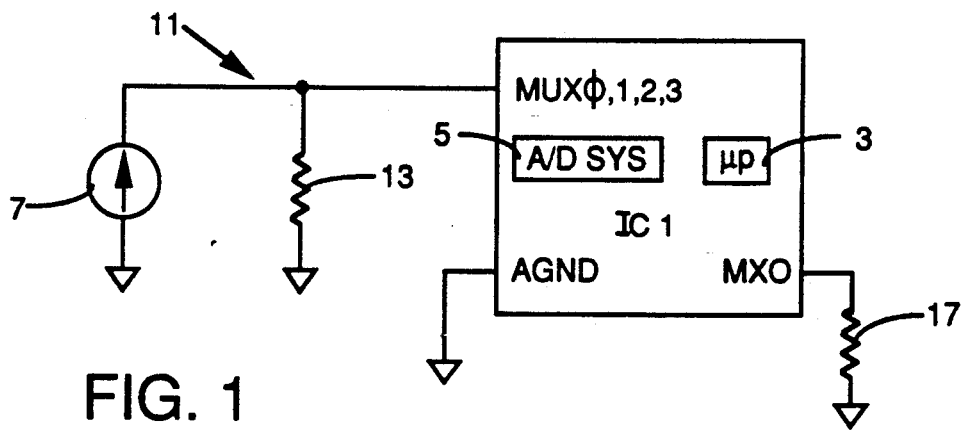
FIG. 1 is a schematic diagram of apparatus in accordance with the prevent invention adapted for converting bipolar analog current inputs.

Referring to FIG. 1, the SuRE Chip IC 1, as discussed above, is a complimentary metal oxide semiconductor (CMOS) IC which includes an on-board microprocessor 3, an analog-to-digital (A/D) subsystem 5 and various input/output devices on a single monolithic chip. The IC 1 includes a number of inputs for analog signals. Some of these inputs namely, the multiplexed inputs, MUX 0, 1, 2, 3, can operate in a current mode for converting applied analog current signals and a voltage mode for A/D conversion of analog voltage signals. However, as also previously mentioned, the IC 1 can only convert analog currents of one polarity, namely negative currents, and only voltages of the opposite polarity, namely positive voltages in the case of the exemplary chip.

In accordance with the invention, the IC 1 is adapted for converting bipolar analog current or voltage signals by utilizing the current mode for converting negative polarity analog signals, and the voltage mode for converting positive polarity analog signals. The conversion is made in one mode, and if the resultant digital signal is non-zero, then that signal is used as the digital signal with the sign determined by the mode in which the signal is generated. For instance, if the signal is generated in the current mode, then the resultant non-zero digital signal is negative. If it was generated in the voltage mode, the digital signal is positive. If the conversion in the first selected mode results in a digital signal of zero value, a second digital signal is generated in the other mode, and the resultant signal is given the polarity associated with the second mode.

Figure 2:
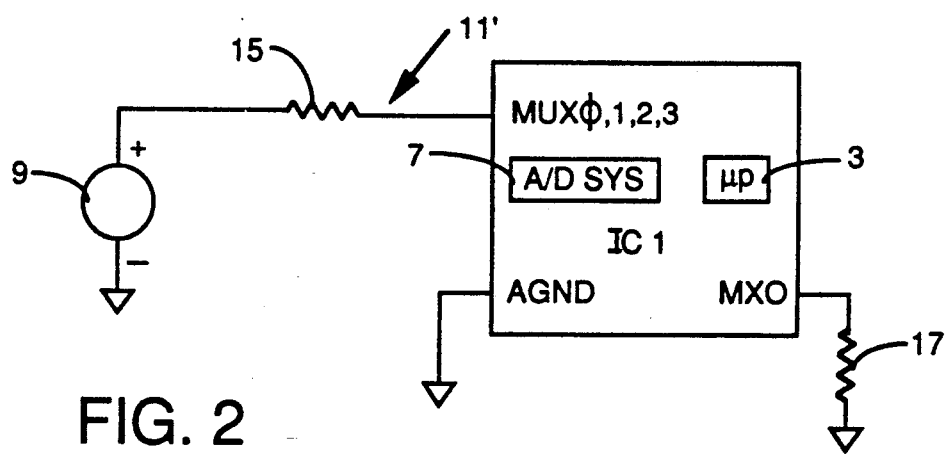
FIG. 2 is a schematic diagram of apparatus in accordance with the invention adapted for converting bipolar analog voltage inputs.

FIG. 1 illustrates the input of an analog current signal $I_{in}$, such as would be generated by the current source 7, into the IC 1. FIG. 2 illustrates the application of a voltage analog signal, $V_{in}$, generated by the voltage source 9 into the IC 1. When any of the IC 1 analog inputs MUX 0, 1, 2, 3, are in the current mode, that input has a very low input impedance so that the voltage VMUX is zero and the current IMUX is equal to $I_{in}$ (for negative currents which are currents flowing out of the analog inputs). When the IC 1 is in the voltage mode, it has a very high input impedance, and therefore the current IMUX equals zero and the voltage at the input VMUX is equal to $V_{in}$ (for positive voltages). The IC 1 in the voltage mode has a full scale voltage of 2.5 volts, and in the current mode has a full scale current of −1.6 ma. It thus has a "full scale equivalent" impedance of (2.5V)/(1.6 ma)=1.56K ohms. In reality, as noted above, the input impedance is either an open circuit or a short circuit. However, if the analog signal sources are designed such that they have an equivalent output impedance equal to the "full scale equivalent" impedance of the MUX 0, 1, 2, 3, inputs (1.56K in the exemplary chip), then A/D conversions can be performed on these inputs in the voltage mode for positive analog signals for both applied current and voltage signals, and in the current mode for negative signals of either type without the need for any special scale factors.

Thus, returning to FIG. 1, an input circuit 11 is provided between the current source 7 and the IC 1 which presents an output impedance to the IC 1 which is substantially equal to the "full scale equivalent" input impedance of the IC. Where the analog inputs are currents, as in FIG. 1, this input circuit comprises an impedance matching resistor 13 connected between the input MUX 0, 1, 2 or 3, and ground which has a value (in this case 1.56K) equal to the "full scale equivalent" impedance of the IC input. When the IC 1 is in the current mode and the input MUX 0, 1, 2, or 3 is at virtual ground, the resistor 13 is shorted and the current into the IC is equal to the current of the current source $I_{in}$. When the IC in FIG. 1 is in the voltage mode, the impedance matching resistor 13 converts the current $I_{in}$ into a voltage which is applied to the input MUX 0, 1, 2, or 3.

Where the applied analog signal is a voltage signal, as in FIG. 2, the input circuit 11' comprises an input resistor 15 in series between the voltage source 9 and the IC input MUX 0, 1, 2, or 3. The value of this resistor 15 is substantially equal to the "full scale equivalent" impedance of the input MUX 0, 1, 2, or 3. When the chip 1 in FIG. 2 is in the voltage mode, so that the input MUX 0, 1, 2, or 3 is at a very high impedance, virtually an open circuit, the voltage at the IC input is the voltage $V_{in}$ of the voltage source 9. With the IC 1 of FIG. 2 in the current mode where the input MUX 0, 1, 2, or 3 is at a virtual ground, or a short circuit, the impedance matching resistor 15 converts the voltage $B_{in}$ into a current.

The resistor 13 in FIG. 1 assures that digital signals generated with the IC 1 in the voltage mode for positive analog currents provided by the analog source 7 will have the same scale as the digital signals generated for negative analog currents in the current mode. Likewise, the resistor 15 in FIG. 2 assures that the digital signals generated with the IC in the current mode for converting negative voltages generated by the voltage source will have the same scale as the digital signals generated from positive voltage signals in the voltage mode.

The integrated circuit 1 has many other inputs including an analog ground input AGND and an MXO input, the purpose of which will be discussed below. This MXO input is connected through a resistor 17, (24.9K in the exemplary case) to ground.

Figure 3:
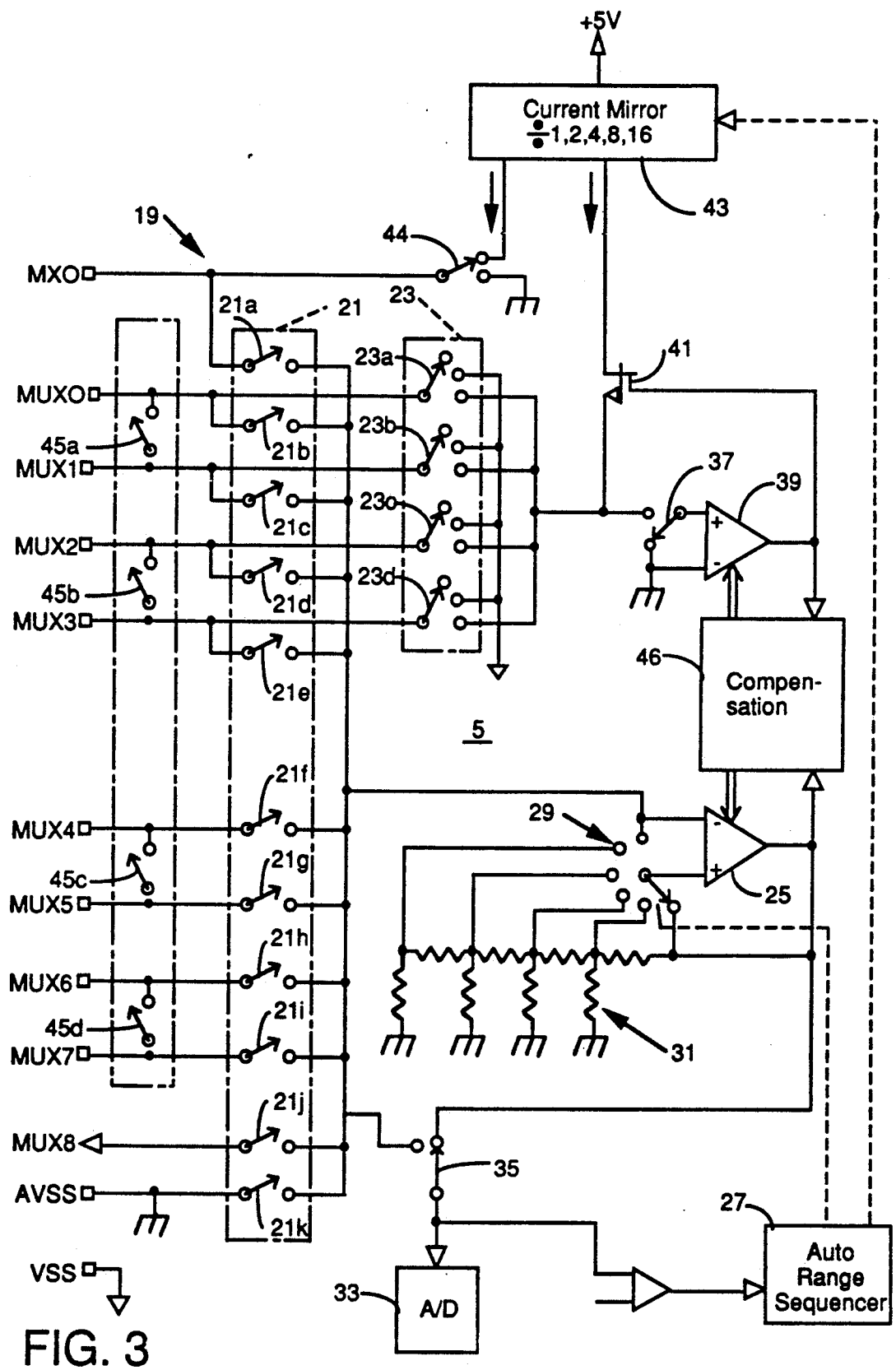
FIG. 3 is a schematic diagram of an A/D conversion subsystem which forms part of the apparatus of FIGS. 1 and 2.

The analog-to-digital subsystem 5 is illustrated schematically in FIG. 3. The analog-to-digital subsystem 5 includes, for example, eight analog input channels for receiving analog voltage and current signals which are converted to 8-bit digital signals with 12-bit resolution. Four of the input channels MUX 0, 1, 2, or 3 can be selected by software run by the microprocessor 3 to operate as either voltage inputs or current inputs. The other analog input channels MUX 4, 5, 6, 7 are only operated as voltage inputs. There are two additional voltage only analog inputs. The input MUX 8 is dedicated in the exemplary system to a temperature sensor, and the input AVSS is connected to an analog ground. The input section 19 of the A/D subsystem 5 includes a multiplexer 21 having switches 21 a–k for selecting the inputs for conversion. An additional multiplexer 23 has switches 23 a–d which selectively connect the input MUX 0, 1, 2, or 3 for current mode operation and connect the unselected inputs to the digital ground pin VSS. The multiplexer 23 provides make-before break switching. The multiplexer 21 selects the input channels for voltage mode operation. In the voltage mode, the analog-to-digital subsystem 5 can accept positive voltages in the range of zero to 2.5 Vdc. These positive input voltages are applied to an auto-zero adjustable gain voltage amplifier 25. These voltage signals can be processed in either an auto-ranging mode or a fixed mode, selectable by the software. If the auto-ranging mode is selected, the voltage input selected by the multiplexer 21 is ranged by an auto-ranging sequencer 27. This auto-ranging sequencer 27 controls a multiplexer 29 which switches appropriate sections of a resistor network 31 connected to the non-inverting input of the voltage amplifier 25. The auto-ranging sequencer 27 automatically adjusts the gain applied to the analog voltage signal until the signal is at least ½ of full scale, but not in overflow. The ranged signal is then converted directly to an 8-bit digital value by an A/D converter 33 for use by the IC 1.

If fixed ranging is selected, the analog voltages can be operated at preselected gain settings of, for example, 1, 2, 4, 8 or 16. The preselected gain settings are set by the multiplexer 29. The output of the voltage amplifier 25 is connected to the A/D converter 33 by a switch 35. The switch 35 is in the position shown in FIG. 3 when voltage gains other than one have been selected. However, when a gain of one is selected, the voltage amplifier 25 is disconnected from the A/D converter 33 by the switch 35 and the analog input voltage is supplied directly to the A/D converter 33.

The dual mode inputs MUX 0, 1, 2, 3 are switched to the current mode by the opening of the multiplexer switches 21 1 b-e and the closing of the appropriate multiplexer switch 23 a-d to connect the selected input through a switch 37 to the non-inverting input of an auto-zeroable current amplifier 39 referenced to analog ground (AVSS). Non-selected inputs MUX 0, 1, 2, 3, are tied to the digital ground pin (VSS) by the multiplexer 23. The current amplifier 39 has a source follower output provided by the FET 41 which maintains the inverting input at a virtual ground by providing current to the selected channel MUX 0, 1, 2, 3 through an adjustable current mirror 43. The current mirror 43 can be set by the auto-range sequencer 27, which can be overridden by the software, to one of the exemplary ratios: 1/1, 1/2, 1/4, 1/8 or 1/16. The ratioed mirror output current is directed to an MXO pin. Thus, the current flowing out of the MXO pin will be a programmable fraction of the current flowing out of the selected input channel MUX 0, 1, 2, 3. As shown in FIGS. 1 and 2, the MXO pin can be connected to ground through the resistor 17. This resistor 17 converts the ratioed current to a voltage which is applied through closure of the multiplexer switch 21a to the A/D converter 33 for conversion to a digital signal. An integrating mode of operation is also possible. In this mode, the resistor 17 is replaced by a capacitor (not shown) so that the ratioed current is integrated. This mode is used for instance with a contactor having a current detector which measures di/dt. The integrated voltage on the capacitor is converted by the A/D converter 33 to a digital current signal. A shorting switch 44 discharges the capacitor under program control.

A sample and hold capability is provided by the IC1 for the inputs MUX0-7 for this mode of operation the inputs are grouped into pairs of switches 45a-d. As the inputs are operated only in the voltage mode for sample and hold operation, further discussion of this feature is not pertinent to the present invention.

The voltage and current amplifiers 25 and 39 have offset voltage compensation circuitry 46 to compensate for offsets inherent in CMOS amplifiers. These uncorrected offsets can be on the order of, for example, 10 mV which can affect the accuracy of the least significant bits of the converted digital value. The circuitry 46 assures that the offset is always a negative voltage between zero and 0.5 mV and forces the amplifiers 25, 39 to have a positive output when the differential input voltage is zero. This offset correction can be done either automatically by the hardware or controlled by the software.

Figure 4:
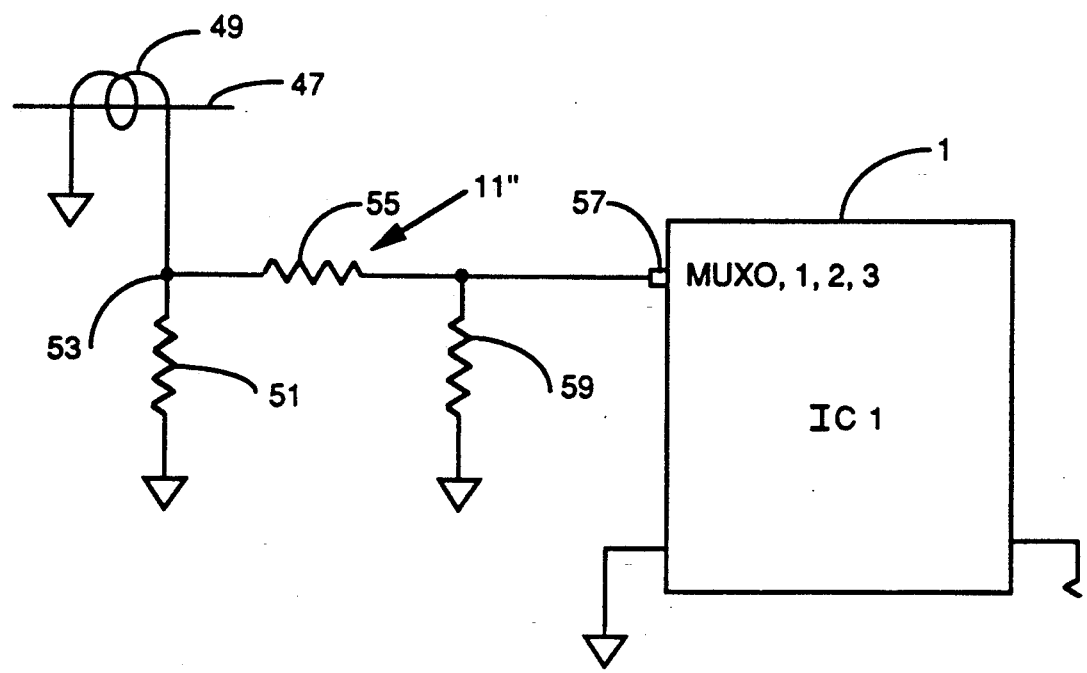
FIG. 4 is a schematic diagram of apparatus in accordance with the invention adapted for converting both current and voltage analog inputs which exceed the full scale current an voltage inputs of the A/D conversion subsystem of FIG. 3.

As mentioned above, the full scale current which can be accepted by the A/D conversion subsystem 5 is −1.6 mA. In many applications, the analog current exceeds this full scale value. Such an application is illustrated in FIG. 4. This would be an application for instance where the IC 1 was utilized, for instance in a circuit breaker. In such an application, the current through a conductor 47 is monitored by a current transformer 49. The current in the conductor 47 could be in the range of hundreds to thousands of amps. The current induced in the current transformer is much less, but still well above 1.6 mA full scale limit of the IC 1. Accordingly, the input circuit 11" includes a burden resistor 51 connected to one side of the current transformer 49 at the node 53 and to ground. The other side of the current transformer is also connected to ground. The burden resistor 51 converts the current flowing through the current transformer 47 to a voltage. An input resistor 55 then converts this voltage back into a current which is a fraction of the current flowing through the current transformer. This resistor 55 is connected between the node 53 and the input terminal 57 of the IC 1. The impedance matching resistor 59 is connected between the terminal 57 and ground. When the selected input MUX 0, 1, 2, 3 is in the current mode, the terminal 57 is at virtual ground and the resistor 59 is short circuited. When the selected input terminal is in the voltage mode, the resistor 59 converts the scaled down current through the resistor 55 to a voltage which is applied to the input terminal 57. The output impedance of the input circuit 11| which is formed by the resistors 55 and 51 in parallel with resistor 59 is substantially equal to the "full scale equivalent" impedance of the IC 1. In the exemplary case, where this "full scale equivalent" impedance of the IC 1 is 1.56K, the burden resistor 51 is 30 ohms, the resistor 55 is 8.25K and the resistor 59 is 1.91K to provide an output impedance in the voltage mode of approximately 1.56K.

The circuit of FIG. 4 can also be used with analog voltage sources. Voltages which exceed the 2.5 V full scale voltage of the A/D conversion subsystem 5 are scaled down by the combination of the burden resistor 51 and input resistor 55 which converts the voltage to a low level current. When the A/D conversion subsystem is in the current mode, the resistor 59 is short circuited and the low level current is fed directly into the MUX 0, 1, 2, or 3 input. In the voltage mode, the resistor 59 converts the low level current back into a voltage scaled to match conversion in the current mode.

Figure 5A:
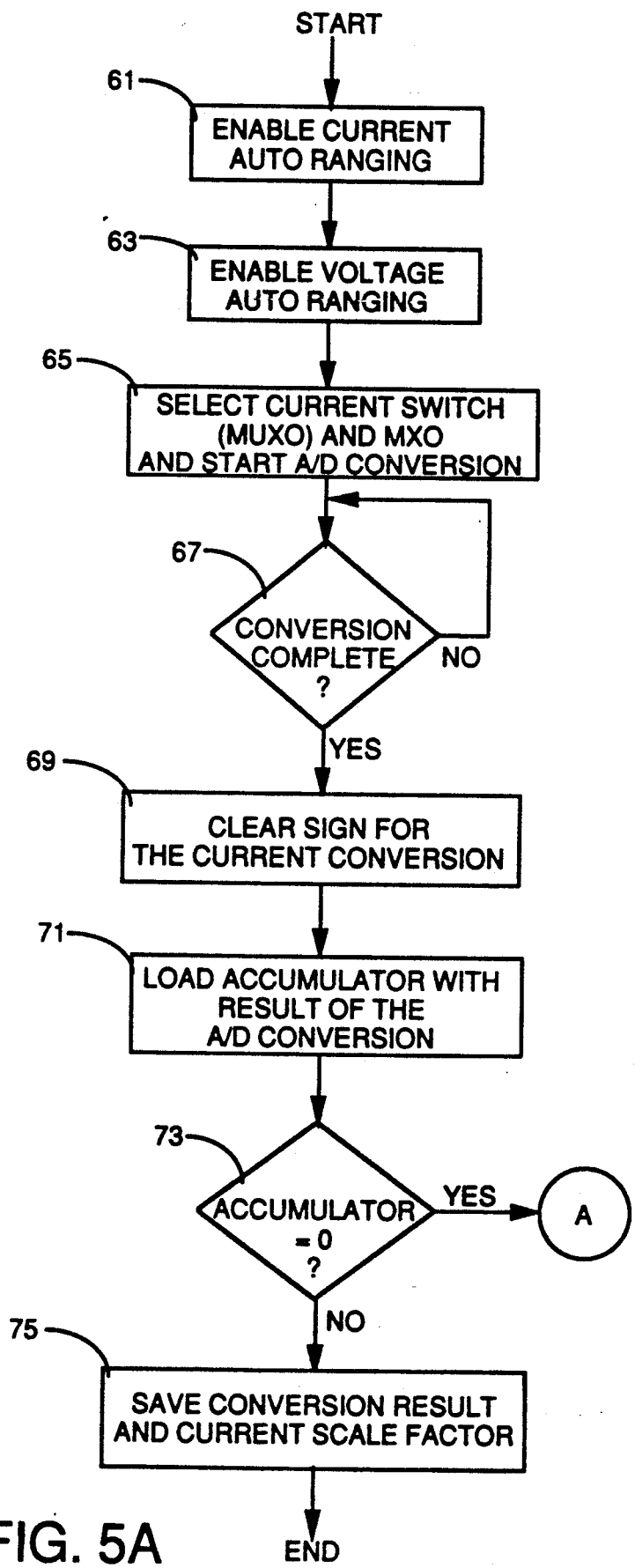
FIGS. 5A and 5B illustrate a flow chart for a program run by the apparatus of FIGS. 1, 2 and 4 in carrying out the invention.
Figure 5B:
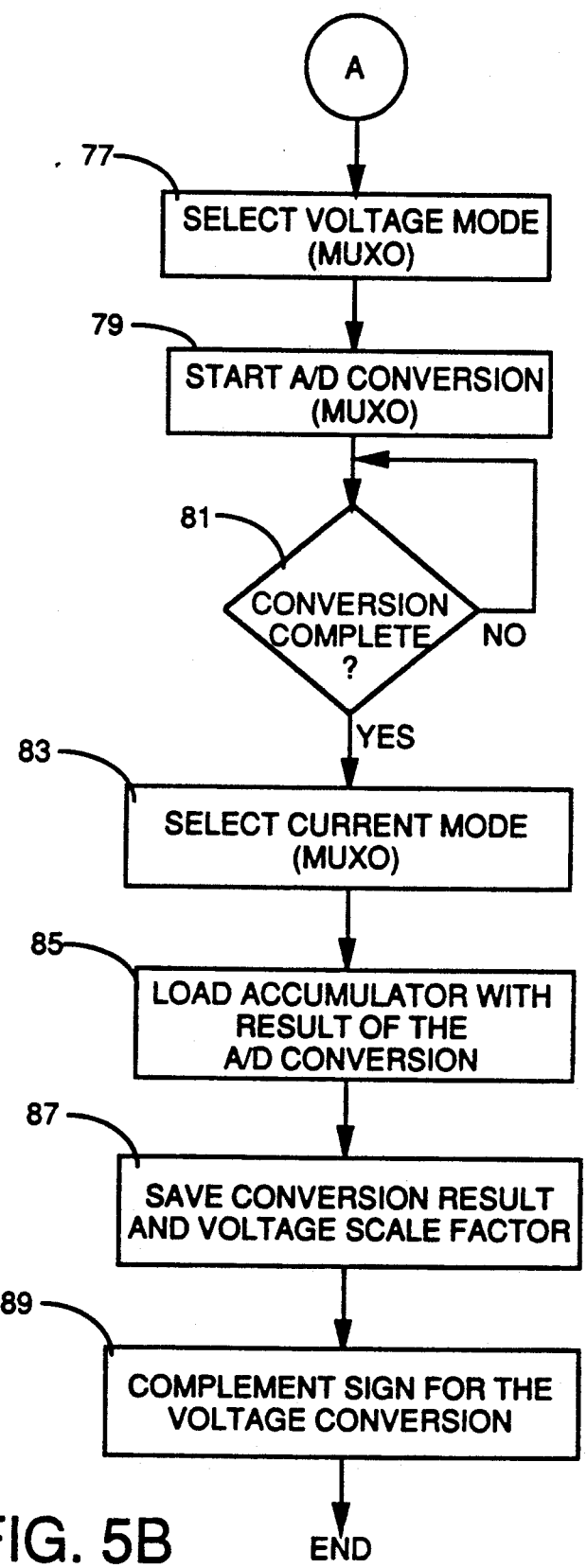

The A/D conversion sub-assembly 5 is controlled by the microprocessor 3 on the IC 1. A flow chart for a suitable routine run by the microprocessor 3 to implement the invention is shown in FIGS. 5A and 5B. Upon selection of the routine, auto-ranging for the current mode and voltage mode are set respectively at 61 and 63. The current mode is then selected for the appropriate input by setting of the current multiplexer switches 23a–d, opening of the voltage multiplexer switches 21b–e, and by connection of the MXO terminal to the A/D converter through closure of the multiplexer switch 21a, all as accomplished at 65. The routine then waits for completion of the A/D conversion at 67. Upon completion of the conversion, the sign for the current conversion is cleared (set to zero) to indicate a negative current at 69. An accumulator is then loaded with the result of the A/D conversion at 71. If the accumulator value does not equal zero at 73, indicating that the analog signal was negative, the digital signal generated by the conversion is saved as the digital signal together with the scale factor at 75.

If the conversion in the current mode produced a zero at 73, then the voltage mode is selected at 77. As previously discussed, this is accomplished by closing the appropriate voltage multiplexer switch 21b–e, and opening of the current multiplexer switches 23a–d. The A/D conversion is then initiated at 79. Again, the routine waits at 81 for the conversion to be completed. The current mode is then reselected at 83 in preparation for the next analog signal to be converted. The accumulator is then loaded with the result of the A/D conversion in the voltage mode at 85. This conversion result is then saved at 87 together with the voltage scale factor and the sign of the digital signal is set to indicate a positive digital signal at 89.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof.

What is claimed is:

1. Apparatus for generating a bipolar digital signal from a bipolar analog signal comprising:

analog-to-digital conversion means, at least one input for said analog-to-digital conversion means including input means selectable between a current mode in which analog signals of a first polarity only are converted to digital signals, and a voltage mode in which analog signals of a second polarity only are converted to digital signals, means selecting one of said current and voltage modes for generation of a first digital signal by said analog-to-digital conversion means from an analog signal applied to said input means, means presenting said first digital signal as said bipolar digital signal when said first digital signal is non-zero, means selecting the other of said current and voltage modes for generation of a second digital signal by said analog-to-digital conversion means when said first digital signal is zero, and means presenting said second digital signal as said bipolar digital signal when generated.

2. The apparatus of claim 1 wherein said input means has a predetermined full scale input current in said current mode and a predetermined full scale input voltage in said voltage mode, and said input includes input circuit means through which said bipolar analog signal is applied to said input means, said input circuit means having an output impedance substantially equal to an input impedance of said input means equal to said full scale input voltage divided by said full scale input current.

3. The apparatus of claim 2 wherein said input means comprises input terminal means which is virtually short circuited to ground potential in the current mode and is virtually open circuited in the voltage mode, and wherein said applied analog signal is an analog current signal, said input circuit means comprising impedance means connected between said input terminal means and ground to which said applied analog currents is applied and which presents an input circuit output impedance to said input terminal means substantially equal to said input impedance of said input means.

4. The apparatus of claim 3 wherein said impedance means comprises an impedance matching resistor connected between said input terminal means and ground, said impedance matching resistor having an impedance substantially equal to said input impedance of said input means.

5. The apparatus of claim 3 wherein said impedance means comprises a burden resistor connected between ground and an input node to which said applied analog current is applied, an input resistor connected between said input node and said input terminal means and an impedance matching resistor connected between said input terminal means and ground, with the impedance of said input resistor plus said burden resistor in parallel with said impedance matching resistor being substantially equal to said input impedance of said input means.

6. The apparatus of claim 2 wherein said input means comprises input terminal means which is virtually short circuited to ground in said current mode and is virtually open circuited in said voltage mode and wherein said applied analog signal is an analog voltage signal, said input circuit means comprising an input resistor through which said analog voltage signal is applied to said input terminal means, said impedance input resistor having an impedance substantially equal to said input impedance of said input means.

7. The apparatus of claim 2 wherein said input means comprises input terminal means which is virtually short circuited to ground potential in the current mode and is virtually open circuited in the voltage mode, said input circuit means comprising a burden resistor connected between ground and an input node to which said analog signal is applied, an input resistor connected between said input node and said input terminal means, and an impedance matching resistor connected between said input terminal means and ground, with the impedance of said input resistor plus said burden resistor in parallel with said impedance matching resistor being substantially equal to said input impedance of said input means.

* * * * *